US008754530B2

(12) United States Patent
Babich et al.

(10) Patent No.: US 8,754,530 B2
(45) Date of Patent: Jun. 17, 2014

(54) SELF-ALIGNED BORDERLESS CONTACTS FOR HIGH DENSITY ELECTRONIC AND MEMORY DEVICE INTEGRATION

(75) Inventors: Katherina E. Babich, Chappaqua, NY (US); Josephine B. Chang, Yorktown Heights, NY (US); Nicholas C. Fuller, North Hills, NY (US); Michael A. Guillorn, Yorktown Heights, NY (US); Isaac Lauer, White Plains, NY (US); Michael J. Rooks, Briarcliff Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 901 days.

(21) Appl. No.: 12/193,339

(22) Filed: Aug. 18, 2008

(65) Prior Publication Data

US 2010/0038723 A1 Feb. 18, 2010

(51) Int. Cl.
*H01L 23/48* (2006.01)

(52) U.S. Cl.
USPC .......... 257/774; 257/773; 257/E21.507; 438/666; 438/675

(58) Field of Classification Search
USPC .......... 257/E21.507, E23.145, 773, 774; 438/666, 675
See application file for complete search history.

(56) References Cited

U.S. PATENT DOCUMENTS

| 5,158,910 | A | * | 10/1992 | Cooper et al. | 438/631 |
|---|---|---|---|---|---|
| 5,710,061 | A | * | 1/1998 | Cleeves | 438/618 |
| 6,010,935 | A | | 1/2000 | Doan | |
| 6,057,581 | A | * | 5/2000 | Doan | 257/401 |
| 6,322,714 | B1 | * | 11/2001 | Nallan et al. | 216/67 |
| 6,342,452 | B1 | | 1/2002 | Coronel et al. | |
| 6,498,096 | B2 | | 12/2002 | Bruce et al. | |
| 7,211,492 | B2 | | 5/2007 | Forbes et | |
| 7,214,994 | B2 | | 5/2007 | Forbes et al. | |
| 2001/0019886 | A1 | | 9/2001 | Bruce et al. | |

(Continued)

FOREIGN PATENT DOCUMENTS

KR 2004081845 9/2004

OTHER PUBLICATIONS

Cleeves, M., et al., "A Novel Disposable Post Technology for Self-aligned Sub-Micron Contacts," VLSI Technology, 1994. digest of Technical Papers. 1994 Syposium in Honolulu, HI, USA, Jun. 7-9, 1994, XP010123004, ISBN: 978-0-7803-1921-9.

(Continued)

*Primary Examiner* — Yu-Hsi D Sun
(74) *Attorney, Agent, or Firm* — Thomas Grzesik; Fleit Gibbons Gutman Bongini & Bianco PL (57) ABSTRACT

A method for fabricating a transistor having self-aligned borderless electrical contacts is disclosed. A gate stack is formed on a silicon region. An off-set spacer is formed surrounding the gate stack. A sacrificial layer that includes a carbon-based film is deposited overlying the silicon region, the gate stack, and the off-set spacer. A pattern is defined in the sacrificial layer to define a contact area for the electrical contact. The pattern exposes at least a portion of the gate stack and source/drain. A dielectric layer is deposited overlying the sacrificial layer that has been patterned and the portion of the gate stack that has been exposed. The sacrificial layer that has been patterned is selectively removed to define the contact area at the height that has been defined. The contact area for the height that has been defined is metalized to form the electrical contact.

7 Claims, 6 Drawing Sheets

(56) References Cited

U.S. PATENT DOCUMENTS

| | | |
|---|---|---|
| 2002/0001931 A1 | 1/2002 | Kim et al. |
| 2006/0148153 A1* | 7/2006 | Kwon et al. ............... 438/197 |
| 2007/0045752 A1 | 3/2007 | Forbes et al. |
| 2007/0049010 A1 | 3/2007 | Burgess et al. |
| 2007/0134909 A1 | 6/2007 | Klee et al. |
| 2008/0026513 A1 | 1/2008 | Costrini et al. |
| 2008/0233738 A1 | 9/2008 | Beyer et al. |
| 2012/0261829 A1* | 10/2012 | Lin et al. .................. 257/774 |

OTHER PUBLICATIONS

Partial International Search Report dated Nov. 18, 2009 for PCT/EP2009/060484.

* cited by examiner

SELF-ALIGNED BORDERLESS CONTACTS FOR HIGH DENSITY ELECTRONIC AND MEMORY DEVICE INTEGRATION

FIELD OF THE INVENTION

The present invention generally relates to the field of semiconductors, and more particularly relates to high density electronic and memory device integration on semiconductor substrates.

BACKGROUND OF THE INVENTION

The formation of electrical contacts to electronic and memory devices is a considerable challenge as the integration density of these devices is increased as a consequence of technology scaling. For example, the projected contact pitch for the 32 nm, 22 nm, and 15 nm nodes are 130 nm, 100 nm, and 80 nm respectively. Alignment of the contact to the source, drain, and gate of the device is critical. In particular, misalignment of the source and drain contacts with respect to the gate can cause electrical shorts, rendering the device inoperable.

Therefore a need exists to overcome the problems with the prior art as discussed above.

SUMMARY OF THE INVENTION

In one embodiment, a method for fabricating a transistor having self-aligned borderless electrical contacts is disclosed. The method includes forming a gate stack on a silicon region. The gate stack includes a gate oxide layer on the silicon region and a gate electrode layer on the gate oxide layer. An off-set spacer is formed surrounding the gate stack. Ion implantation is performed as necessary to dope the device. An activation anneal is performed to activate the dopant and recrystallize the Si in the source/drain regions of the devices. A silicide is formed on the source/drain regions and a portion of the gate stack of the device by depositing a metal layer, reacting the metal with the Si by a rapid thermal annealing process, and then removing the unreacted metal through a selective chemical etch. A sacrificial layer is deposited comprised of a carbon-based film overlying the silicon region, the gate stack, and the off-set spacer. A thickness of the sacrificial layer defines a height of an electrical contact above and extending to the silicided region of the source/drain and the gate stack of the transistor. A pattern is defined in the sacrificial layer to define a contact area for the electrical contacts to the device. Defining the pattern exposes at least a portion of the gate stack and the source/drain (i.e. the regions outside of the patterned areas). A dielectric layer is deposited overlying the sacrificial layer that has been patterned and the portion of the gate stack and source/drain that has been exposed. The sacrificial layer that has been patterned is selectively removed exposing the contact areas. The contact areas are metalized forming electrical contacts to the source, drain and gate of the device.

In another embodiment, a transistor is disclosed. The transistor includes a gate stack. This gate stack is formed on a silicon region and includes a gate oxide layer on the silicon region and a gate electrode on the gate oxide layer. An off-set spacer surrounds the gate stack. A patterned sacrificial layer is adjacent to the gate stack that defines a contact area for an electrical contact. A thickness of the sacrificial layer defines a height of an electrical contact above and extending to a silicided region defining a source/drain of a transistor.

In yet another embodiment, an integrated circuit is disclosed. The integrated circuit includes a circuit supporting substrate. The circuit supporting substrate comprises a transistor. The transistor includes a gate stack. The gate stack is formed on the silicon region and includes a gate oxide layer on the silicon region and a gate electrode on the gate oxide layer. An off-set spacer surrounds the gate stack. A patterned sacrificial layer is adjacent to the gate stack that defines a contact area for an electrical contact. A thickness of the sacrificial layer defines a height of an electrical contact above and extending to a silicided region defining a source/drain of a transistor.

One advantage of the various embodiments of the present invention is that borderless contacts are created that meet the demands of electronic and memory device scaling. Conventional lithographic techniques can be used to define a masking material that defines a pattern in a sacrificial material. The patterned sacrificial material ultimately defines the electrical contact to the device. The sacrificial material is chosen such that it can be patterned with high selectivity to the electronic device allowing aspects of the device geometry to self-align the bottom of the contact, forming a borderless contact.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

As required, detailed embodiments of the present invention are disclosed herein; however, it is to be understood that the disclosed embodiments are merely examples of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure and function. Further, the terms and phrases used herein are not intended to be limiting; but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

FIGS. 1 to 17 illustrate one or more processes for forming a transistor device with self-aligned borderless contacts according to one embodiment of the present invention. In these figures although only two transistors are shown arranged in a side-by-side manner, an infinite array of transistor can exist. In other words, the environment of FIGS. 1-17 is a high density environment. Also, it should be noted that although a planar transistor device 100 is shown in FIG. 1, the various embodiments of the present invention are also applicable non-planar transistor or memory devices as well.

It should be noted that the overall fabrication scheme discussed below may be standard until after the formation of silicide regions. For example, as in a normal process flow the various silicide areas are formed within a silicon region. At this step, in accordance with the various embodiments of the present invention, self-aligned borderless contacts are then created.

Figure 1:
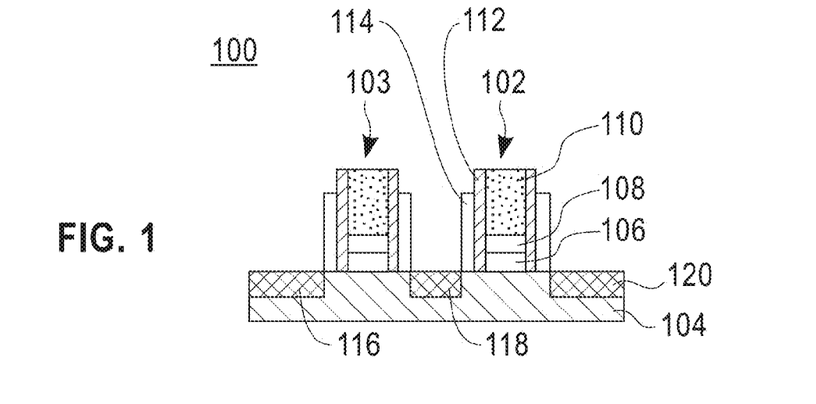
FIGS. 1-10 are cross-sectional views of various layers of a circuit supporting substrate illustrating a process for forming self-aligned borderless contacts for high integration density electronic and memory device according to one embodiment of the present invention.

The transistor device 100 of FIG. 1 comprises one or more gate stacks 102, 103 formed using any conventional gate patterning process. The gate stack 102 is formed over a region 104. In one embodiment, the region 104 is a silicon region 104 comprising at least a portion of a silicon layer and/or a silicon substrate. Such a region 104 can, in one embodiment, comprise a surface area of the silicon layer and/or silicon substrate. It should be noted that the region 104 comprises the entire layer or substrate or a portion (less than the whole) of the layer/substrate.

A Silicone dioxide layer, in one embodiment, may be present beneath the Si region (not shown). In this embodiment, a silicon substrate is present under the oxide layer (not shown). The gate stack 102, in one embodiment, includes a gate oxide 106 and a gate electrode 108. The gate oxide 106 can be (but not limited to) $SiO_2$, $SiO_xN_y$, or a metal oxide such as (but not limited to) $HfO_2$, $HfSiO_x$, $HfSiO_xN_y$, $Ta_2O_5$, $TiO_2$, $Al_2O_3$, $Y_2O_3$ and $La_2O_5$. In some embodiments, the metal oxide creates a high-k layer. The material comprising the gate electrode 108 is determined by the choice of the gate oxide 106. For example, in the case of Si-based oxides, polysilicon can be used. In the case of metal oxides, a metal can be used such as (but not limited to) TiN, Ta, TaN, TaCN, TaSiN, TaSi, AlN, W and Mo. The gate oxide 106 and gate electrode 108 can be deposited using any conventional deposition process such as metal-organic chemical vapor deposition ("MOCVD") or atomic-layer deposition ("ALD") and physical vapor deposition ("PVD"), MOCVD, or ALD, respectively.

The gate stack 102 can also include an optional deposition of an amorphous Si or a poly Si layer 110 which is deposited using conventional processes such as LPCVD, RT CVD or silicon sputtering. FIG. 1 also shows that one ore more offset spacers 112, 114 have been deposited and etched. In particular, FIG. 1 shows an oxide spacer 112 has been deposited around the gate stack 102 ad that another spacer such as a nitride spacer 114 has been deposited and formed around the oxide spacer 112. These spacers 112, 114 can be deposited, for example, by PECVD, LPCVD, ALD or RTCVD. It should be noted that the transistor device 100 can include both spacers 112, 114; only the oxide spacer 112; or only the nitride spacer 114. FIG. 1 also shows that silicide regions 116, 118, 120 (typically with Ni or Co) have been formed within the Si region 104 and on the gate stack 103 and 102. For example, silicide areas 116, 118, 120 are formed for contacts using the spacer structure 112, 114. This is achieved by removing any native oxide present on the Si layer 104 or Si gate material 102,103 (e.g., through a wet etch using HF), depositing a metal, performing an anneal to form silicide, and then selectively removing the metal but leaving the silicide untouched (e.g., through an aqua regia wet etch). The silicided regions 116, 118, 120 can be formed from (but are not limited to) metals such as nickel, cobalt, titanium, or platinum.

Figure 2:
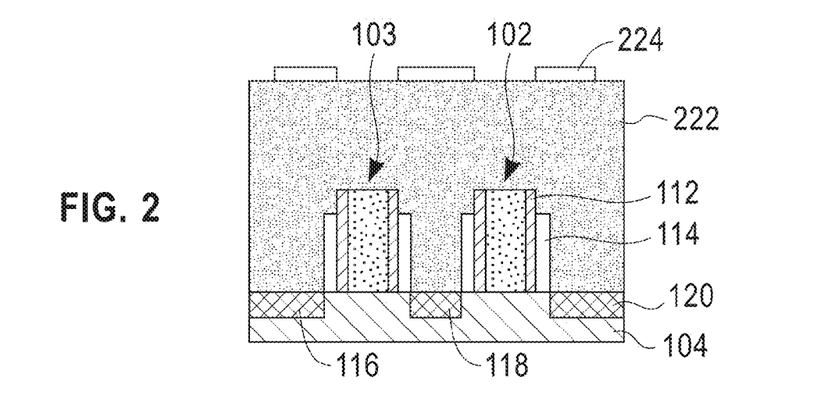

After the transistor device 100 has been formed as shown in FIG. 1, a sacrificial material is deposited onto the transistor device 100, thereby forming a sacrificial layer 222, as shown in FIG. 2. It should be noted that from hereon in "sacrificial material" and "sacrificial layer" are referred as one in the same. The sacrificial material 222, in one embodiment, is a carbon-based film that has the following properties: the material can be deposited or coated onto the substrate in a manner that covers the substrate topography such as (but not limited to) spin casting, plasma deposition, physical vapor deposition, chemical vapor deposition; the material can be patterned using a directional dry etch plasma chemistry that does not damage the materials present on the substrate (e.g. $O_2$, $N_2$, $H_2$ or $CO_2$ plasma); the material can survive temperatures compatible with microelectronic middle of the line ("MOL") processing (e.g., 25 to 45° C.); and the material is a dielectric. Examples of a suitable sacrificial material 222 include ODL, NFC, ACL, plasma deposited amorphous carbon, or sputtered carbon. It should be noted that the present invention is not limited to using only these materials.

In one embodiment, the thickness of the sacrificial material 222 is chosen to define the height of the contact to be formed above and extending to a silicided region 116, 118, 120 defining a source/drain of a transistor. A lithographic process is then used to define a masking material 224 for defining a pattern in the sacrificial material 222. For example, lithography techniques such as (but not limited to) electron beam lithography and optical lithography using single exposure, double exposure and double exposure/double etch techniques can be used to define the masking material. The masking material 224 can be any material that can be deposited onto the sacrificial material 222 and patterned selectively to the sacrificial material 222.

Figure 3:
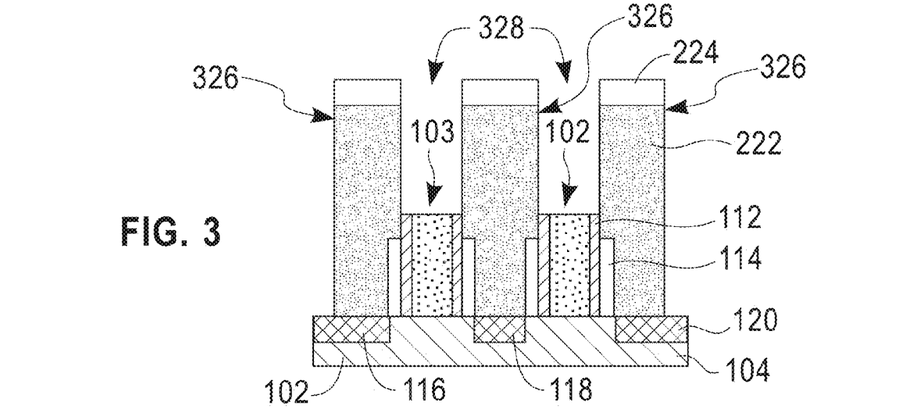
Figure 4:
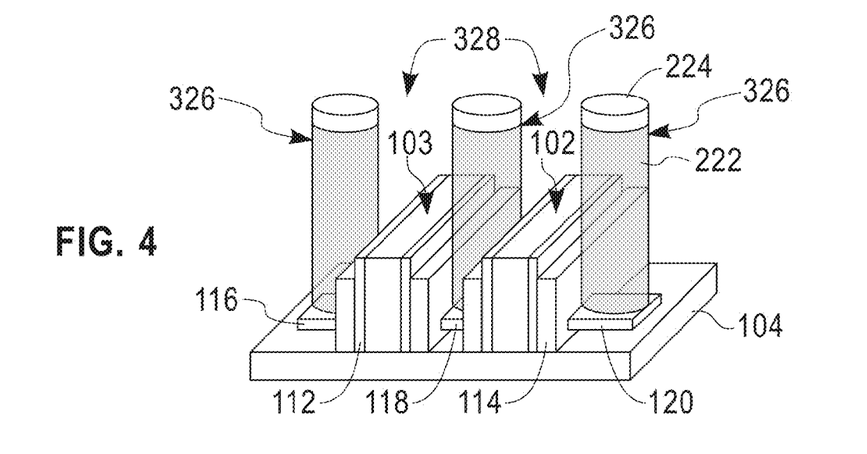

FIG. 2 shows the patterned mask material 224. The masking material 224 can include (but is not limited to) silicon oxide, silicon nitride, or antireflective coatings. Also, the masking material 224 can be a resist so long as it can be used as a mask for defining patterns in the sacrificial material 222. An example of such a material includes (but is not limited to) hydrogen silsesquioxanes, which is a silicon-oxide like electron beam lithography resist. Following lithographic definition of the masking material 224 and subsequent patterning steps, the sacrificial material 222 is patterned using pattern transfer techniques that do not compromise or degrade the operation of the electronic or memory device 100. FIG. 3 and FIG. 4, which is a three-dimensional view of FIG. 3, show this dry pattern transfer of the masking pattern 224 into the sacrificial layer 222.

As can be seen from FIG. 3 and FIG. 4, columns 326 of the sacrificial layer 222 are created under each of the pattern mask material sections 224. In other words, the pattern transfer techniques etched away all but the sacrificial material 222 under the patterning material 224 creating columns 326 of sacrificial material with canyons 328 there between. The sacrificial material 222 has been removed from the spacer 112, 114 without damaging the spacer 112, 114 in any way and stopped on the silicided regions 116, 118, 120 without damaging the silicide 116, 118. 120. Similarly, contacts to the gate electrode can be made though are not shown in these drawings. Also, as shown in FIG. 3 and FIG. 4, the width of the sacrificial material 222 after patterning expands over the spacer 112, 114. This is advantageous because the contacts can be defined larger than the region (e.g., the silicide regions) that is to be contacted. Furthermore, the contacts need not be perfectly aligned to the silicide regions. This enables the contact patterning to be performed with looser process tolerances. Therefore, in one embodiment, the patterning material 224 is defined with a larger dimension than the silicide 116 to which the contact is to terminate on. These cylinders/columns 326 of sacrificial material 222 define where the contacts are going to be. The type of sacrificial material 222 that has been used and the patterning techniques that have been selected do not affect the regions where the contacts will ultimately land on the device 100. In the embodiments of FIGS. 3-17 the contacts are to terminate on the silicide regions 116.

The self-aligned and borderless aspects of the various embodiments are illustrated by the fact that selectivity of the etch (e.g., the patterning techniques discussed above) that defines the sacrificial material 222, as shown in FIG. 3 and FIG. 4, completely defines where the contacts will land on the device 100. Stated differently, when the patterning technique/etch is performed, the sacrificial material 222 defines the contact area because of the selectivity of the materials within the transistor device 100 once the sacrificial material 222 is etched between the two gates 102, 103. This is a self-aligning feature of the various embodiments because the bottom of the contact is itself aligned and is borderless because the contact is being defined by the geometry of the device 100. The general region of the contact is lithographically defined and the footprint of the contact is self-aligned.

Figure 5:
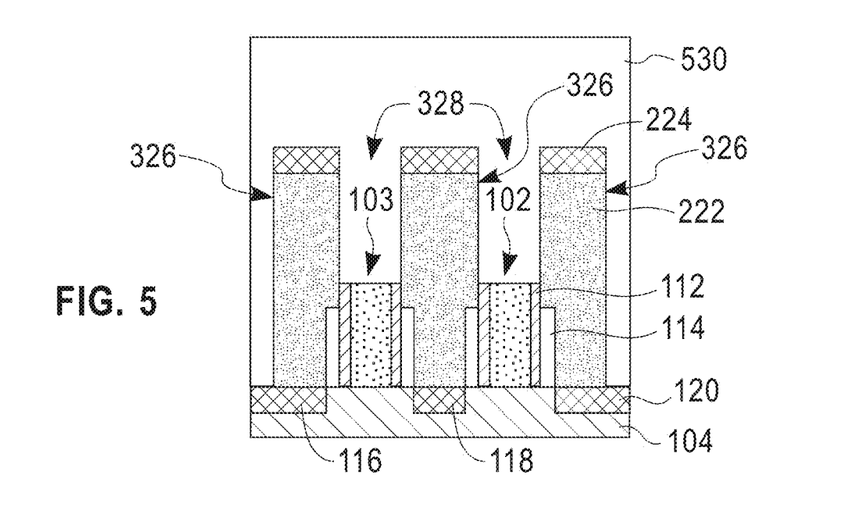
Figure 6:
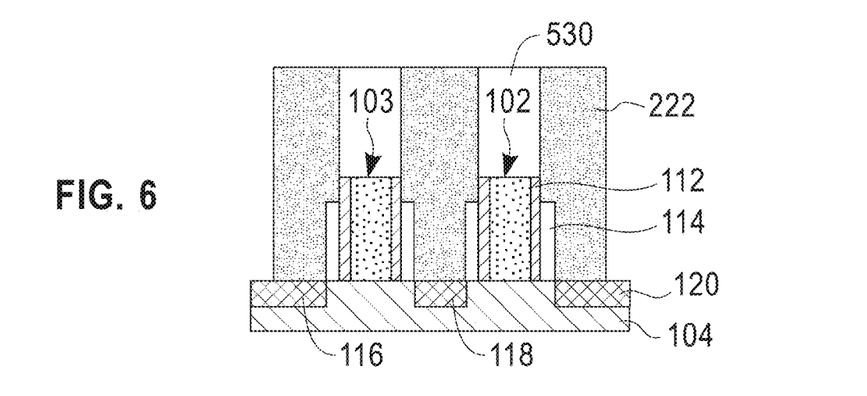
Figure 7:
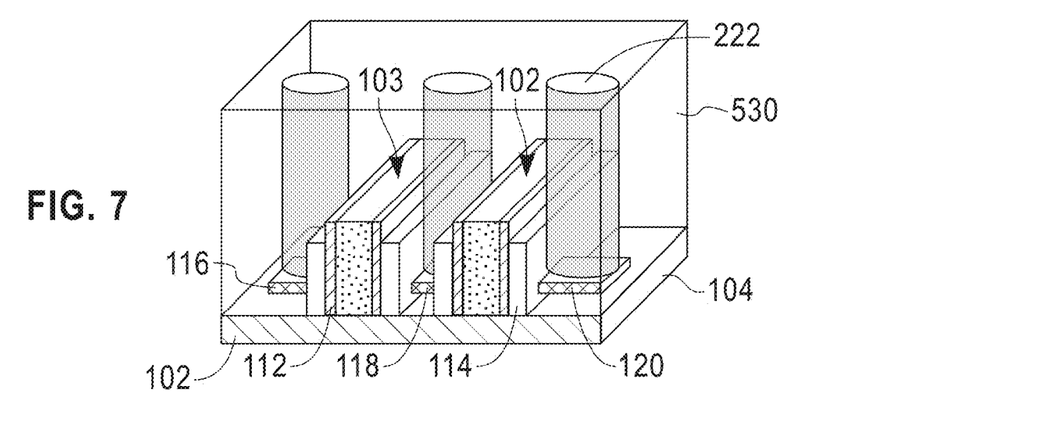

Once the sacrificial material 222 has been patterned/etched as shown in FIG. 3 and FIG. 4, a suitable dielectric 530 such as (but not limited to) plasma deposited or spin on $SiO_2$ is deposited onto the substrate, as shown in FIG. 5. This dielectric 530 encapsulates the devices and the sacrificial material 222. It is important that this dielectric 530, in one embodiment, completely fill the features of the substrate without forming voids or "keyholes". This dielectric is typically referred to as the MOL dielectric 430. The MOL dielectric 530 is then polished back to reveal the sacrificial material 222 using chemical mechanical polishing, as shown in FIG. 6 and FIG. 7. The sacrificial material 222 can be used as a "polish stop" to help define the thickness of the planarized MOL dielectric 430. As can be seen in FIG. 6 and FIG. 7 the polishing process stops once it reaches the sacrificial material 222.

Figure 8:
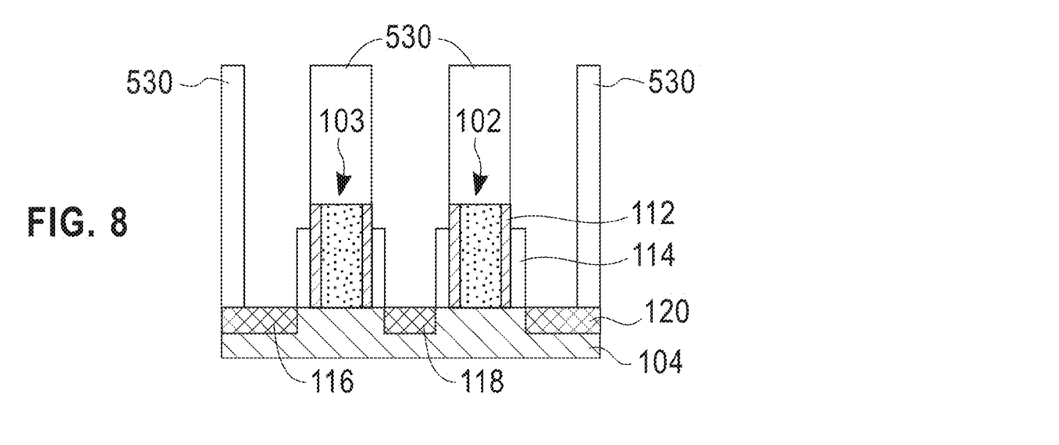
Figure 9:
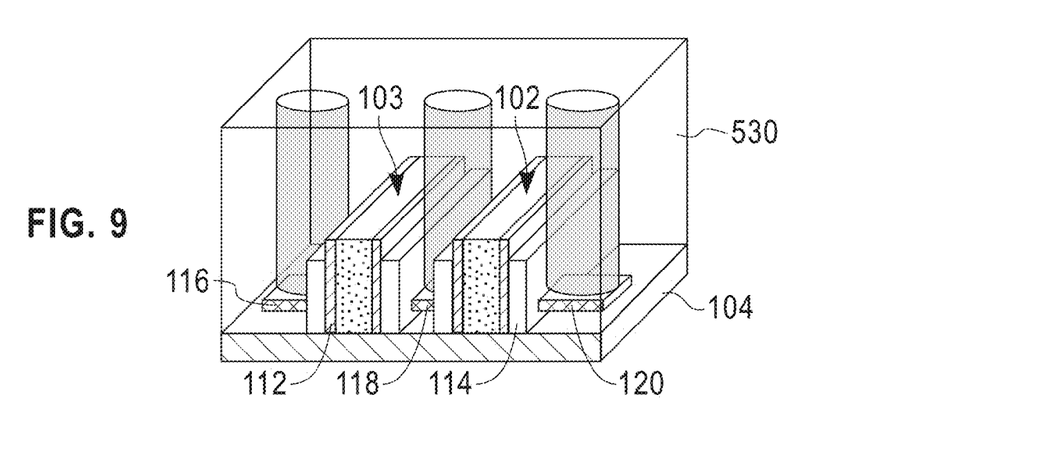
Figure 10:
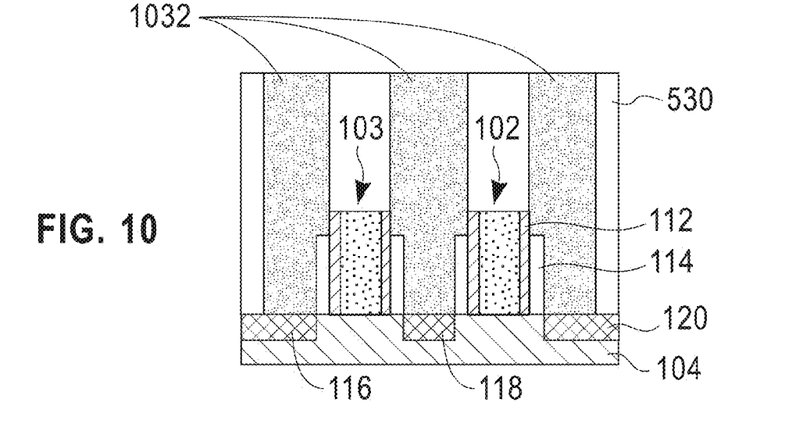

The sacrificial material 222 is then removed using either wet or dry isotropic removal techniques as shown in FIG. 8 and FIG. 9. This process is chosen such that it is selective to the MOL dielectric 530 and the materials present in the device 100. This enables the formation of a self-aligned borderless contact. Once the sacrificial material 222 has been removed, a metalized contact 1032 can formed using conventional CVD, PVD, ALD or plating-based techniques or some combination of these techniques, as shown in FIG. 10.

As can be seen from the above discussion the various embodiments of the present invention are advantageous because contacts are self aligned to the source and drain. The self-aligned contact(s) is a borderless contact that is defined using a carbon-based film sacrificial layer. The borderless contact can be defined with relaxed dimensional and alignment specifications. The bottom of the contact, where these parameters are critical is defined by aspects of the device geometry. This is done in such a way as to avoid compromising the functionality of the device or degrading its performance.

Figure 11:
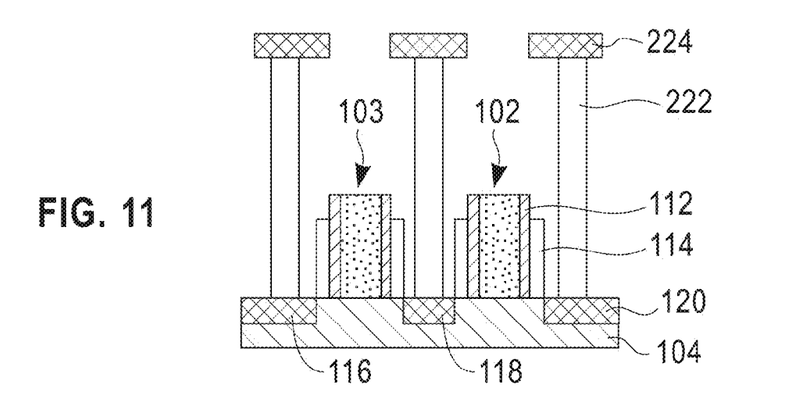
FIG. 11 is a cross-sectional view of a circuit supporting substrate illustrating a process for trimming a sacrificial layer deposited for forming self-aligned borderless contacts according to one embodiment of the present invention.
Figure 12:
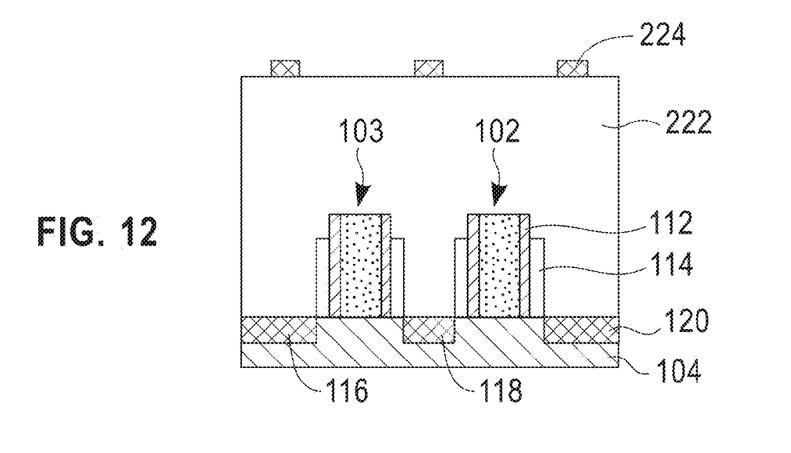
FIG. 12 is a cross-sectional view of a circuit supporting substrate illustrating a process for trimming a masking material according to an embodiment of the present invention.

FIGS. 11-17 show additional embodiments for forming a transistor device with self-aligned borderless contacts. For example, FIG. 11 shows that after the sacrificial material 222 patterning/etching process of FIG. 3 and FIG. 4, the sacrificial material 222 can be trimmed. In one embodiment, the trimming process is performed using a suitable etching technique such as an isotropic etch process to form sub-lithographic features. In another embodiment, as shown in FIG. 12, the masking material 224 can be trimmed using a suitable etching technique to produce contacts at sub-lithographic dimensions. When the sacrificial material 222 is removed using either wet or dry isotropic removal techniques, as shown in FIGS. 8 and 9, the width of the canyons 228 created are smaller than if the material 222 had not been trimmed. Trimming is advantageous because the sacrificial material 222 can be dimensioned after a lithographic process and not use the lithographic process for dimensioning, reducing the tolerances of the lithographic process.

Figure 13:
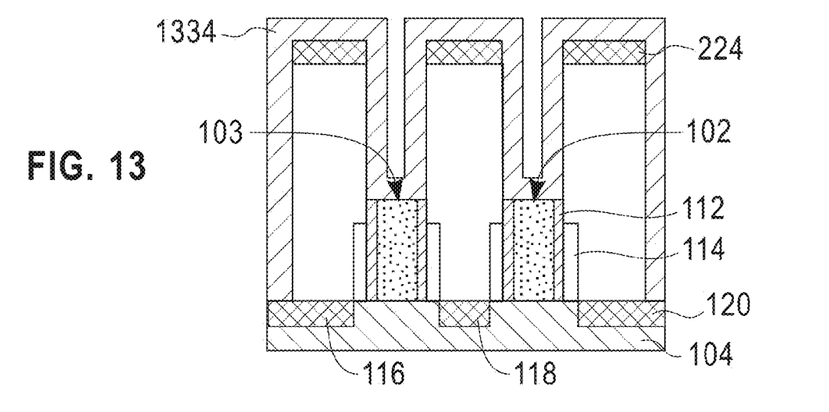
FIGS. 13-17 are cross-sectional views of a circuit supporting substrate illustrating a process for depositing a liner during the formation of self-aligned borderless contacts according to one embodiment of the present invention.
Figure 14:
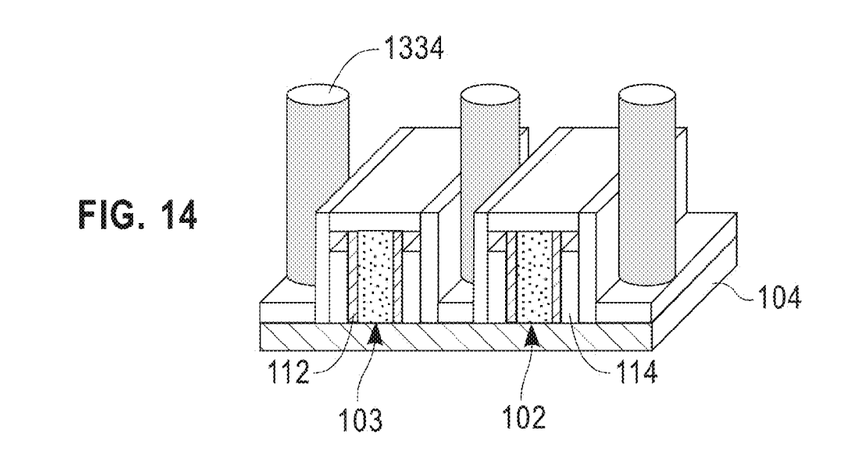
Figure 15:
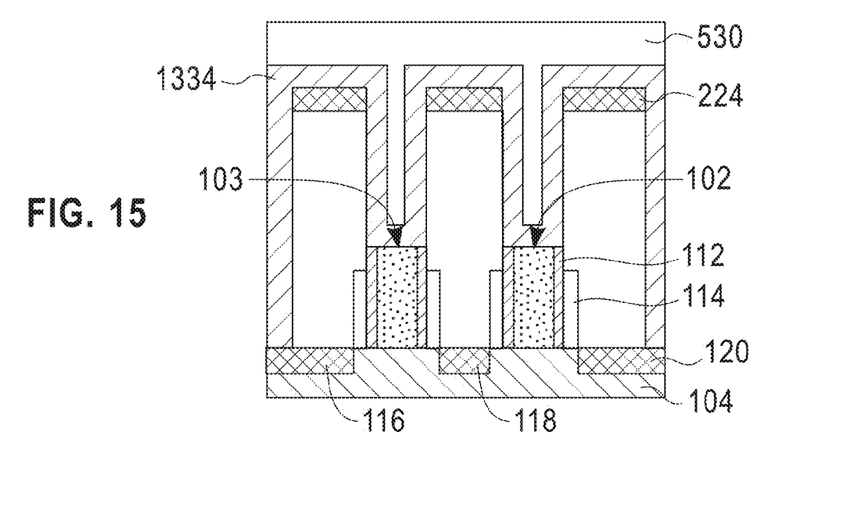

FIGS. 13-17 illustrate another embodiment implementing a liner 1334. In particular, the liner material 1334 can be coated onto the substrate following pattern transfer into the sacrificial material, as shown in FIGS. 13-14. The liner material 1334 is deposited over the Si layer 104 and encapsulates the masking material 24, the sacrificial material 222, the spacer 112, 114, and the gate stack 102.

This liner 1334 may be used to improve the electrical performance of the device 100, and in one embodiment, is a stressed nitride liner. The liner 1334 may be used to improve the reliability of the contact metallization 1032. Also, the liner 1334 may improve integration of subsequent wiring levels by providing an etch stop on top of the gate 102 to prevent gate to wiring shorts. In one more embodiment, the process can be integrated with a dual damascene wire level patterning to enable metallization of the contact and wiring level simultaneously.

Figure 16:
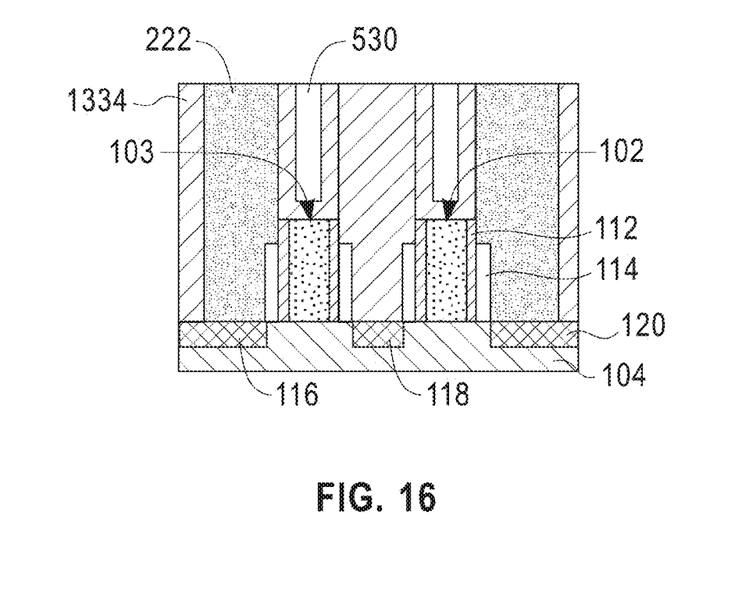
Figure 17:
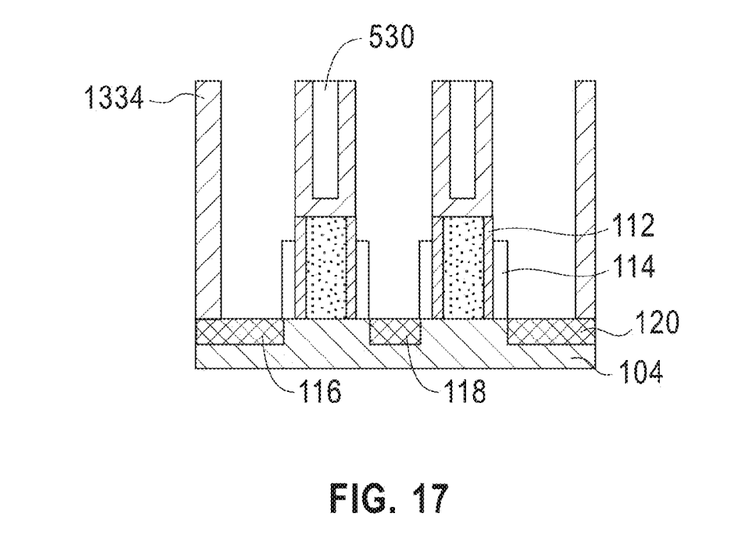

Once the liner 1334 is deposited, the MOL dielectric 530 is deposited onto the substrate similar to FIG. 5. However, in the embodiment of FIG. 15, the MOL dielectric 530 is also deposited over liner 1334. The polishing process of FIGS. 6 and 7 is then performed and stops once it reaches the liner 1334, as shown in FIG. 16. A liner etch back process can then be performed as shown in FIG. 16, thereby exposing the sacrificial material 222. The sacrificial material 222 is then removed, as shown in FIG. 17, using either wet or dry isotropic removal techniques similar to the process shown in FIGS. 8 and 9. Once the sacrificial material 222 the metalized contact 1032 can be formed as discussed above with respect to FIG. 10.

It should be noted that some of the features of the examples of this invention may be used to advantage without the corresponding use of other features. As such, the foregoing description should be considered as merely illustrative of the principles, teachings, examples and exemplary embodiments of this invention, and not in limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A transistor comprising:
   a silicon region;
   a gate stack on the silicon region, the gate stack including
      a gate oxide layer on the silicon region and a gate electrode on the gate oxide layer, and
   an off-set spacer surrounding the gate stack;
   a first patterned sacrificial layer adjacent to a first side of the off-set spacer;
   a second patterned sacrificial layer adjacent to a second side of the off-set spacer, wherein each of the first and second patterned sacrificial layers substantially contacts a first and second silicided region, respectively, within the silicon region, wherein each of the first and second patterned sacrificial layers extends to the first and second silicided region, respectively,
   and wherein each of the first and second patterned sacrificial layers is free of contact with at least a top surface of a portion of off-set spacer in contact with the gate stack; and
   a first contact area and a second contact area defined by the first and second patterned sacrificial layers, respectively, where the each of the first and second contact areas comprises a height dimension defined by a thickness of the first and second patterned sacrificial layers, respectively,
   and wherein the first and second contact areas are above and extend to the first and second silicided region, respectively.

2. The transistor of claim 1, wherein the gate stack also includes a silicon nitride hard mask layer over the gate electrode layer.

3. The transistor of claim 1, further comprising:
   a dielectric layer overlying a top portion of the gate stack.

4. The transistor of claim 1, wherein a portion of each of the first and second patterned sacrificial layers extends beyond the first and second silicided regions, respectively, and contacts a portion of the silicon region.

5. An integrated circuit comprising:
   a circuit supporting substrate including a transistor, wherein the transistor includes:
      a silicon region;
      a gate stack on the silicon region, the gate stack including a gate oxide layer on the silicon region and a gate electrode on the gate oxide layer, and
      an off-set spacer surrounding the gate stack;
      a first patterned sacrificial layer adjacent to a first side of the off-set spacer;
      a second patterned sacrificial layer adjacent to a second side of the off-set spacer, wherein each of the first and second patterned sacrificial layers substantially contacts a first and second silicided region, respectively, within the silicon region, wherein each of the first and second patterned sacrificial layers extends to the first and second silicided region, respectively,
      and wherein each of the first and second patterned sacrificial layers is free of contact with at least a top surface of a portion of the off-set spacer in contact with the gate stack; and
      a first contact area and a second contact area defined by the first and second patterned sacrificial layers, respectively, where the each of the first and second contact areas comprises a height dimension defined by a thickness of the first and second patterned sacrificial layers, respectively,
      and wherein the first and second contact areas are above and extend to the first and second silicided region, respectively.

6. The integrated circuit of claim 5, wherein the gate stack also includes a silicon nitride hard mask layer over the gate electrode layer.

7. The integrated circuit of claim 5, wherein the transistor further comprises:
   a dielectric layer overlying a top portion of the gate stack.

* * * * *